US011395420B2

(12) United States Patent
Dong et al.

(10) Patent No.: US 11,395,420 B2
(45) Date of Patent: Jul. 19, 2022

(54) DISPLAY PANEL AND DISPLAY APPARATUS

(71) Applicant: BOE TECHNOLOGY GROUP CO., LTD., Beijing (CN)

(72) Inventors: Liming Dong, Beijing (CN); Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 147 days.

(21) Appl. No.: 16/767,566

(22) PCT Filed: Dec. 26, 2019

(86) PCT No.: PCT/CN2019/128737
§ 371 (c)(1),
(2) Date: May 27, 2020

(87) PCT Pub. No.: WO2020/155969
PCT Pub. Date: Aug. 6, 2020

(65) Prior Publication Data
US 2021/0204424 A1   Jul. 1, 2021

(30) Foreign Application Priority Data
Feb. 2, 2019   (CN) .......... 201910107881.X

(51) Int. Cl.
*H05K 5/02*   (2006.01)
*G06F 3/147*   (2006.01)
(Continued)

(52) U.S. Cl.
CPC .......... *H05K 5/0217* (2013.01); *G06F 3/147* (2013.01); *H01L 51/5237* (2013.01); *H05K 5/0017* (2013.01)

(58) Field of Classification Search
CPC .... H05K 5/0217; H05K 5/0017; G06F 3/147; G06F 1/1652; G09F 9/30
See application file for complete search history.

(56) References Cited

U.S. PATENT DOCUMENTS

2006/0169989 A1* 8/2006 Bhattacharya ...... H01L 51/0021
428/917
2016/0104850 A1   4/2016 Joo et al.
(Continued)

FOREIGN PATENT DOCUMENTS

CN   105514115 A   4/2016
CN   106652802 A   5/2017
(Continued)

OTHER PUBLICATIONS

State Intellectual Property Office of the People's Republic of China, Office Action and Search Report Issued in Application No. 201910107881.X, dated Feb. 3, 2020, 12 pages. (Submitted with Partial Translation).
(Continued)

*Primary Examiner* — Hung S. Bui
*Assistant Examiner* — Sagar Shrestha
(74) *Attorney, Agent, or Firm* — McCoy Russell LLP

(57) ABSTRACT

This disclosure relates to the field of display technology, in particular to a display panel and a display apparatus. The display panel includes a flexible display substrate and a force-dispersion component. The force-dispersion component is disposed at the flexible display substrate. The stiffness of the force-dispersion component is greater than that of the flexible display substrate. The force-dispersion component is capable of dispersing a stretching force experienced by the flexible display substrate.

9 Claims, 4 Drawing Sheets

(51) Int. Cl.
    *H01L 51/52*           (2006.01)
    *H05K 5/00*            (2006.01)

(56) References Cited

U.S. PATENT DOCUMENTS

| | | | |
|---|---|---|---|
| 2016/0212822 A1 | 7/2016 | Kim | |
| 2019/0036049 A1* | 1/2019 | Kim | H01L 51/0097 |
| 2019/0079630 A1* | 3/2019 | Kho | G06F 3/041 |
| 2019/0341580 A1* | 11/2019 | Gu | H01L 51/003 |
| 2020/0051881 A1* | 2/2020 | Park | B32B 15/043 |
| 2020/0135065 A1* | 4/2020 | Song | H05K 1/189 |
| 2020/0285095 A1* | 9/2020 | Okumura | G09F 9/30 |
| 2021/0157431 A1* | 5/2021 | Gu | G06F 1/1601 |
| 2021/0191467 A1* | 6/2021 | Sunwoo | G06F 1/1637 |
| 2021/0354429 A1* | 11/2021 | Watanabe | G09F 9/00 |

FOREIGN PATENT DOCUMENTS

| | | |
|---|---|---|
| CN | 206400960 U | 8/2017 |
| CN | 107195252 A | 9/2017 |
| CN | 107464502 A | 12/2017 |
| CN | 108076175 A | 5/2018 |
| CN | 207781086 U | 8/2018 |
| CN | 109285966 A | 1/2019 |
| CN | 109801881 A | 5/2019 |

OTHER PUBLICATIONS

China National Intellectual Property Administration, International Search Report Issued in Application No. PCT/CN2019/128737, dated Mar. 26, 2020, WIPO, 15 pages. (Submitted with Partial Translation).

\* cited by examiner

DISPLAY PANEL AND DISPLAY APPARATUS

CROSS-REFERENCE TO RELATED APPLICATIONS

The present application is a U.S. national phase application of PCT Application No. PCT/CN2019/128737 filed on Dec. 26, 2019, which claims a priority to Chinese Patent Application No. 201910107881.X filed in China on Feb. 2, 2019. The entire contents of each of the above-listed applications are hereby incorporated by reference for all purposes.

TECHNICAL FIELD

The present disclosure relates to the field of display technology, in particular to a display panel and a display apparatus.

BACKGROUND AND SUMMARY

In recent years, with the development of society and the advancement of science and technology, flexible display products start to enter a rapid development stage. A flexible display product is bendable and foldable and also has a stretching function.

At present, in the process of stretching a flexible display product, a stretching force concentrates locally on the flexible display product. As a result, pixels of the flexible display product tend to deform non-uniformly, thereby resulting in relatively poor display uniformity of the flexible display product.

An objective of the present disclosure is to provide a display panel and a display apparatus which have relatively good display uniformity.

To achieve the foregoing objective, the following technical solution is provided.

According to an aspect of the present disclosure, a display panel is provided, including:
a flexible display substrate;
a force-dispersion component, disposed at the flexible display substrate, where the stiffness of the force-dispersion component is greater than that of the flexible display substrate, and the force-dispersion component is used to disperse a stretching force experienced by the flexible display substrate.

In an exemplary embodiment of the present disclosure, a size of the force-dispersion component is equal to that of the flexible display substrate in a direction perpendicular to both a stretching direction and a thickness direction of the flexible display substrate.

In an exemplary embodiment of the present disclosure, the force-dispersion component includes a plurality of force-dispersion components, the plurality of force-dispersion components include a first force-dispersion component and a second force-dispersion component, and the first force-dispersion component and the second force-dispersion component are disposed opposite to each other in a stretching direction of the flexible display substrate and are respectively disposed at edges of the flexible display substrate.

In an exemplary embodiment of the present disclosure, the force-dispersion component is disposed on a back side of the flexible display substrate.

In an exemplary embodiment of the present disclosure, the display panel further includes:
a limiting member, including a connecting component and a limiting component connected to the connecting component, where the connecting component is slidably connected to the force-dispersion component, the limiting component is located on a stretching side of the force-dispersion component and there is a gap between the limiting component and the force-dispersion component.

In an exemplary embodiment of the present disclosure, both ends of the connecting component are provided with the limiting component.

In an exemplary embodiment of the present disclosure, the connecting component is an elastic rod.

In an exemplary embodiment of the present disclosure, the elastic rod includes a stiff rod portion and an elastic portion connected to the stiff rod portion.

In an exemplary embodiment of the present disclosure, the elastic rod is completely made of an elastic material.

According to another aspect of the present disclosure, a display apparatus including the display panel of any one of the foregoing embodiments is provided.

In the display panel and the display apparatus provided in the present disclosure, when the display panel is stretched by a concentrated force, because the stiffness of a force-dispersion component disposed on a flexible display substrate is greater than that of the flexible display substrate, the force-dispersion component may be used to disperse a stretching force, to enable the stretching force to be relatively uniformly applied to the flexible display substrate, so that the deformation uniformity of pixels of the flexible display substrate can be improved, and the display uniformity of the flexible display substrate can further be improved, thereby improving a display effect.

BRIEF DESCRIPTION OF THE DRAWINGS

The accompanying drawings are incorporated in the specification and constitute a part of this specification. The accompanying drawings show embodiments according to the present disclosure, and are used together with the specification to explain the principle of the present disclosure. Apparently, the drawings accompanying the following descriptions show only some embodiments of the present disclosure, and a person of ordinary skill in the art may still derive other drawings from these accompanying drawings without creative efforts.

DETAILED DESCRIPTION

The exemplary implementations will be more completely described with reference to the accompanying drawings. However, the exemplary implementations may be implemented in many forms and should not be construed as being limited to the implementations set forth herein. Rather, these implementations are provided so that the present disclosure will be thorough and complete, and will fully convey the concept of the exemplary implementations to those skilled in the art. In the accompanying drawings, the same numerals represent the same or similar structures, and therefore the detailed descriptions of the same elements or components will be omitted.

Although the relative terms such as "upper" and "lower" are used in this specification to describe the relative relationship of one component to another component shown in the accompanying drawings. However, these terms are used in this specification only for convenience of describing, for example, the direction of an example as shown in the accompanying drawing. It can be understood that if a device shown in the accompanying drawings is flipped and turned upside down, the described "upper" component will become the "lower" component. When a structure is "on" another structure, it may indicate that a structure is integrally formed on another structure, or that a structure is "directly" disposed on another structure, or that a structure is "indirectly" disposed on another structure via other structure.

In the accompanying drawings, for clarity, the thickness of an area or a layer may be exaggerated. In the accompanying drawings, the same numerals represent the same or similar structures, and therefore the detailed descriptions of the same elements or components will be omitted. The terms "a", "an", and "the" are used to represent that there is one or more elements, components, or the like. The terms "include" and "have" are used to represent a non-exclusive inclusion and represent that there may be other elements, components, or the like in addition to the listed elements, components, or the like. The terms "first" and "second" are only used for labeling, and are not intended to limit the quantity of objects.

Figure 1:
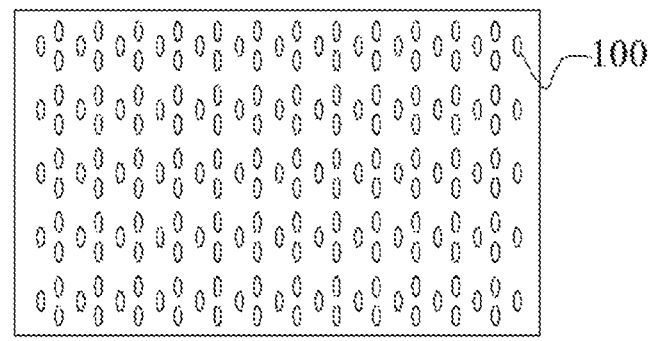
FIG. 1 is a schematic diagram of holes adjacent to pixels of a flexible display panel.
Figure 2:
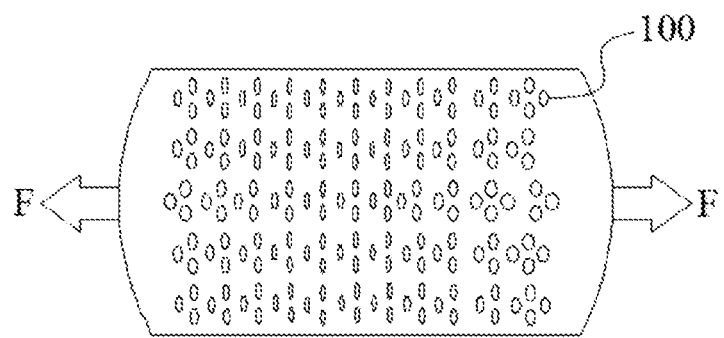
FIG. 2 is a schematic diagram of the deformation of holes adjacent to pixels.

In the related art, as shown in FIG. 1, holes 100 are provided adjacent to pixels of a flexible display panel to implement a stretching function of the panel. As shown in FIG. 2, when a stretching force F is applied to the flexible display panel, because the stretching force F is relatively concentrated, forces applied to the flexible display panel are nonuniform. Therefore, the holes 100 adjacent to the pixels deform nonuniformly, resulting in nonuniform deformation of the pixels, and further resulting in relatively poor display uniformity of the flexible display panel, leading to deteriorated user experience.

Figure 3:
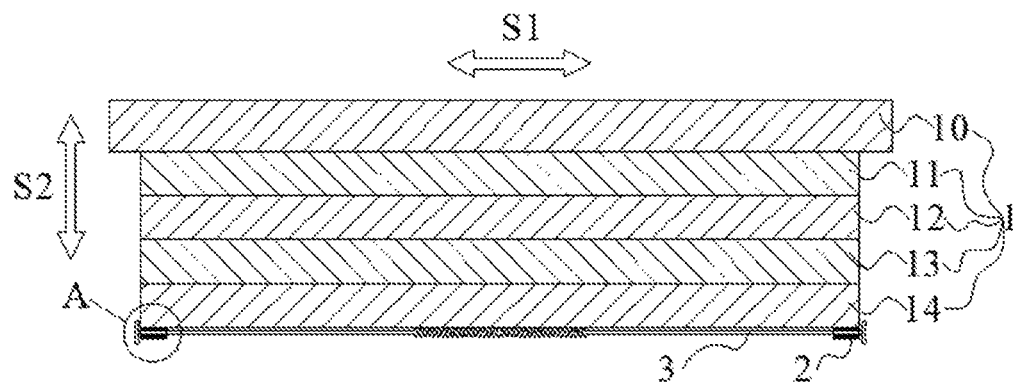
FIG. 3 is a schematic structural diagram of a display panel according to an implementation of the present disclosure.

To resolve the foregoing problem, an implementation of the present disclosure provides a display panel. The display panel may be a flexible display panel. As shown in FIG. 3, the display panel includes a flexible display substrate 1 and a force-dispersion component 2. The force-dispersion component 2 is disposed at the flexible display substrate 1. The stiffness of the force-dispersion component 2 is greater than that of the flexible display substrate 1. In this way, when the display panel is stretched by a concentrated force, because the stiffness of the force-dispersion component 2 disposed at the flexible display substrate 1 is greater than that of the flexible display substrate 1, the force-dispersion component 2 is capable of dispersing a stretching force experienced by the flexible display substrate 1. That is, the concentrated stretching force can be uniformly dispersed over the flexible display substrate 1 by means of the force-dispersion component 2, so that the deformation uniformity of pixels of the flexible display substrate 1 can be improved, and the display uniformity of the flexible display substrate 1 can further be improved, thereby improving the display effect of the display panel.

The parts of the display panel provided in the implementation of the present disclosure are described below in detail with reference to the accompanying drawings.

As shown in FIG. 3, the flexible display substrate 1 may include a plurality of layer structures. For example, the flexible display substrate 1 may include a cover plate 10, a touch control layer 11, a polarizer 12, a light-emitting layer 13, a back film 14, and the like. The cover plate 10, the touch control layer 11, and the polarizer 12 are stacked on a light-outgoing side of the light-emitting layer 13. The back film 14 is disposed on a back side of the light-emitting layer 13. The light-outgoing side is a side of the light-emitting layer 13 that is facing the user. The back side is a side of the light-emitting layer 13 that is opposite the light-outgoing side.

As the outermost layer of the flexible display substrate 1, the cover plate 10 may be a light-transmitting rigid coating or transparent glass, which is not limited specifically herein. The touch control layer 11 may be disposed on a side of the cover plate 10 that is facing the light-emitting layer 13, to receive a touch signal. The polarizer 12 may be disposed on a side of the touch control layer 11 that is away from the cover plate 10, to allow light vibrating in a specific direction to pass. The light-emitting layer 13 may be an organic light-emitting layer. The organic light-emitting layer may be provided with the foregoing holes 100. The back film 14 is used to implement insulation protection of the light-emitting layer 13. The back film 14 may be made of an insulative material such as polyethylene terephthalate (PET) or polyimide (PI), which is not limited specifically herein.

It should be understood that the structure of the flexible display substrate 1 is not limited to the foregoing structure and may be in another form. For example, the touch control layer 11 may be omitted. Possible variations are not enumerated herein.

Figure 5:
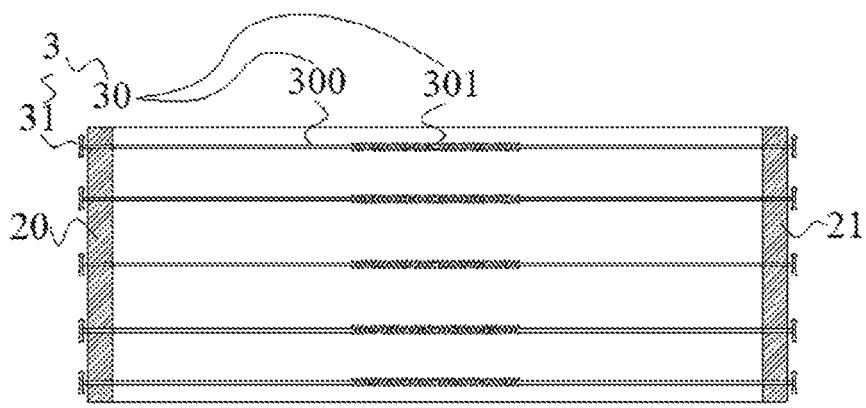
FIG. 5 is a bottom view of a display panel according to an implementation of the present disclosure.

In an embodiment, as shown in FIG. 3 and FIG. 5, the size of the force-dispersion component 2 is equal to the size of the flexible display substrate 1 in a direction perpendicular to both a stretching direction S1 and a thickness direction S2 of the flexible display substrate 1, so that a force dispersion effect of the force-dispersion component 2 can be improved, and a concentrated stretching force can be more uniformly applied to the flexible display substrate 1 through the force-dispersion component 2, thereby the force-bearing uniformity of the flexible display substrate 1 can be improved, and the display uniformity of the flexible display substrate 1 can be improved, thus improving a display effect.

For example, the force-dispersion component 2 may be of a U-shaped structure or a sheet-shaped structure.

When the force-dispersion component 2 is of a U-shaped structure, the U-shaped structure may envelop an edge of the flexible display substrate 1. The edge is not used for display, that is, the edge is a non-display area of the flexible display substrate 1.

When the force-dispersion component 2 is of a sheet-shaped structure, the sheet-shaped structure may be located on the light-outgoing side or the back side of the flexible display substrate 1. Optionally, the force-dispersion component 2 may be disposed on the back side of the flexible display substrate 1. For example, the force-dispersion component 2 may be disposed on a side of the back film 14 that is away from the light-emitting layer 13.

In the embodiment, the force-dispersion component 2 is disposed on the back side of the flexible display substrate 1, which helps to increase a display area of the flexible display substrate 1.

Certainly, the force-dispersion component 2 may have other shapes, which are not enumerated herein.

For example, the force-dispersion component 2 may be made of stainless steel or rubber. The stiffness of rubber is greater than that of the flexible display substrate 1. Certainly, the force-dispersion component 2 may be made of other material as long as the stiffness of the material is greater than that of the flexible display substrate 1. Details thereof are not described herein.

When the force-dispersion component 2 is made of rubber, the entire back side of the flexible display substrate 1 may be provided with the force-dispersion component 2. When the force-dispersion component 2 is made of stainless steel, to ensure the flexibility of the entire display panel, a part of the back side of the flexible display substrate 1 may be provided with the force-dispersion component 2. Specifically, the force-dispersion component 2 may be disposed at an edge of the back side of the flexible display substrate 1.

Considering that the display panel is usually stretched at two ends in the process of stretching, a plurality of force-dispersion components 2 may be disposed. For example, the force-dispersion components 2 may include a first force-dispersion component 20 and a second force-dispersion component 21. The first force-dispersion component 20 and the second force-dispersion component 21 are disposed opposite to each other in a stretching direction S1 of the flexible display substrate 1 and are respectively disposed at edges of the flexible display substrate 1, thereby ensuring the force-bearing uniformity at two edges of the flexible display substrate 1.

The force-dispersion component 2 and the flexible display substrate 1 may be attached to each other by bonding. For example, a transparent adhesive is applied to where the force-dispersion component 2 and the flexible display substrate 1 meet, to enable the attachment between the force-dispersion component 2 and the flexible display substrate 1. Certainly, a threaded connection may be used. Details are not described herein again.

As shown in FIG. 3 and FIG. 5, the display panel provided in the implementation of the present disclosure further includes a limiting member 3. There may be a plurality of limiting members 3. The plurality of limiting members 3 may be uniformly distributed in the direction perpendicular to both the stretching direction S1 and the thickness direction S2 of the flexible display substrate 1, to limit and protect the flexible display substrate 1.

The limiting member 3 may include a connecting component 30 and a limiting component 31 connected to the connecting component 30. When the flexible display substrate 1 deforms under a stretching force, the force-dispersion component 2 disposed on the flexible display substrate 1 may slide along the connecting component 30. The limiting component 31 is used to bear against the force-dispersion component 2 to prevent the flexible display substrate 1 from further stretching, so that a deformation amount of the flexible display substrate 1 is less than a maximum allowable deformation amount, thereby preventing the flexible display substrate 1 from being damaged by an excessively large deformation, to enable a position limit protection of the flexible display substrate 1.

The limiting component 31 may be of a rod shape, but is not limited thereto. The limiting component 31 and the connecting component 30 may be connected to each other by welding, clamping, bonding, or the like, which is not limited specifically herein.

Figure 4:
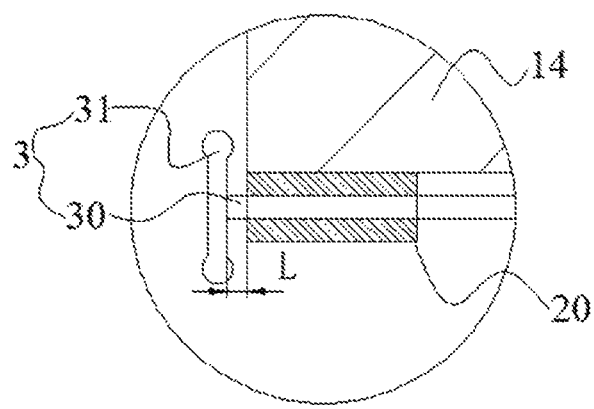
FIG. 4 is an enlarged view of a portion A in FIG. 3.

The limiting component 31 may be located on a stretching side of the force-dispersion component 2. That is, a direction from the force-dispersion component 2 to the limiting component 31 is the stretching direction S1. There is a gap L between the limiting component 31 and the force-dispersion component 2. As shown in FIG. 4, the gap L is less than the maximum allowable deformation amount of the flexible display substrate 1. When the flexible display substrate 1 deforms under a stretching force and the force-dispersion component 2 slides along the connecting component 30 by a distance of the gap L, the limiting component 31 bears against the force-dispersion component 2 and stops the flexible display substrate 1 from further stretching, to prevent the flexible display substrate 1 from being damaged by excessive stretch.

For example, a plurality of limiting components 31 of the limiting member 3 may be provided. Specifically, both ends of the connecting component 30 are provided with the limiting component 31. The limiting component 31 at one end may be disposed on a stretching side of the first force-dispersion component 20 and there is a gap L between the limiting component 31 and the first force-dispersion component 20. The limiting component 31 at the other end may be disposed on a stretching side of the second force-dispersion component 21 and there is a gap L between the limiting component 31 and the second force-dispersion component 21.

Certainly, there may be only one limiting component 31 which is disposed at one end of the connecting component 30, which is not limited specifically herein.

For example, the connecting component 30 may be of a circular rod shape. In this case, the force-dispersion component 2 may be provided with a through hole. The diameter of the through hole should be slightly greater than the diameter of the circular rod, so that the circular-rod-shaped connecting component 30 can pass through the through hole, to enable a slidable connection between the connecting component 30 and the force-dispersion component 2. Certainly, the connecting component 30 may be of a rectangular rod shape, which is not limited specifically herein.

The connecting component 30 may be an elastic rod. When the flexible display substrate 1 deforms under a stretching force, the elastic rod also deforms. After the stretching force is removed, the elastic rod recovers from deformation, and in so doing, aids the flexible display substrate 1 to recover. In an optional embodiment, as shown in FIG. 5, the elastic rod may include a stiff rod portion 300 and an elastic portion 301 connected to the stiff rod portion 300. Two stiff rod portions 300 may be provided in the elastic rod. One end of each of the two stiff rod portions 300 is provided with a limiting component 31, and the other ends of the two stiff rod portions 300 are connected by the elastic portion 301. When the flexible display substrate 1 deforms under a stretching force, the elastic portion 301 also deforms. After the stretching force is removed, the elastic portion 301 recovers from deformation, and in so doing, aids the flexible display substrate 1 to recover. It needs to be noted that a stretch amount of the elastic portion 301 is less than a stretch amount of the flexible display substrate.

Figure 6:
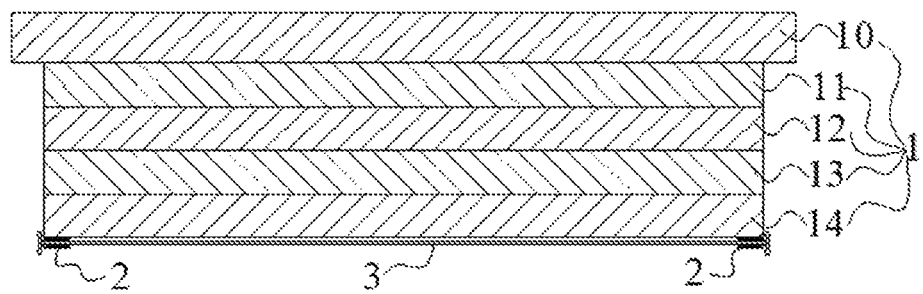
FIG. 6 is a schematic structural diagram of a display panel according to another implementation.
Figure 7:
FIG. 7 is a bottom view of a display panel according to another implementation.

In another optional embodiment, the elastic rod may be completely made of an elastic material. As shown in FIG. 6 and FIG. 7, the elastic rod has a simple structure, so that the processing difficulty can be reduced.

An exemplary implementation of the present disclosure further provides a display apparatus including the foregoing display panel.

After considering the specification and practicing the present disclosure, a person skilled in the art would easily conceive of other implementations of the present disclosure. This application is intended to cover any variations, usages, or adaptive changes of the present disclosure that follow general principle of the present disclosure and include the common general knowledge or technical means in the art that is not described in the present disclosure. The specification and the embodiments are merely exemplary, and the scope and spirit of the present disclosure are defined in the appended claims.

The invention claimed is:

1. A display panel, comprising:
   a flexible display substrate;
   a force-dispersion component, disposed at the flexible display substrate, wherein a stiffness of the force-dispersion component is greater than that of the flexible display substrate, and the force-dispersion component is used to disperse a stretching force experienced by the flexible display substrate; and
   a limiting member, comprising a connecting component and a limiting component connected to the connecting component, wherein the connecting component is slidably connected to the force-dispersion component, the limiting component is located on a stretching side of the force-dispersion component and there is a gap between the limiting component and the force-dispersion component.

2. The display panel according to claim 1, wherein a size of the force-dispersion component is equal to that of the flexible display substrate in a direction perpendicular to both a stretching direction and a thickness direction of the flexible display substrate.

3. The display panel according to claim 1, wherein the display panel comprises a plurality of force-dispersion components, the plurality of force-dispersion components comprise a first force-dispersion component and a second force-dispersion component, and the first force-dispersion component and the second force-dispersion component are disposed opposite to each other in a stretching direction of the flexible display substrate and are respectively disposed at edges of the flexible display substrate.

4. The display panel according to claim 1, wherein the force-dispersion component is disposed on a back side of the flexible display substrate.

5. The display panel according to claim 1, wherein both ends of the connecting component are provided with the limiting component.

6. The display panel according to claim 1, wherein the connecting component is an elastic rod.

7. The display panel according to claim 6, wherein the elastic rod comprises a stiff rod portion and an elastic portion connected to the stiff rod portion.

8. The display panel according to claim 6, wherein the elastic rod is completely made of an elastic material.

9. A display apparatus, comprising the display panel according to claim 1.

* * * * *